US006675704B2

(12) United States Patent
Lin et al.

(10) Patent No.: US 6,675,704 B2
(45) Date of Patent: Jan. 13, 2004

(54) SOLDER PASTE STENCILING APPARATUS FOR MINIMIZING RESIDUE OF SOLDER PASTE

(75) Inventors: Cheng-Yuan Lin, Lu Chu Hsiang (TW); Sheng-Long Wu, Lu Chu Hsiang (TW); Te-Chang Huang, Lu Chu Hsiang (TW); Hao-Wei Liang, Lu Chu Hsiang (TW); Pin-Hsuan Chang, Lu Chu Hsiang (TW)

(73) Assignee: Compeq Manufacturing Company Limited (TW)

( * ) Notice: Subject to any disclaimer, the term of this patent is extended or adjusted under 35 U.S.C. 154(b) by 0 days.

(21) Appl. No.: 10/093,995

(22) Filed: Mar. 6, 2002

(65) Prior Publication Data

US 2003/0167941 A1 Sep. 11, 2003

(51) Int. Cl.⁷ .......................... B41F 15/36; B41F 15/08
(52) U.S. Cl. ................ 101/127.1; 101/126; 101/123
(58) Field of Search ........................ 101/114, 123, 101/124, 127.1, 126, 129

(56) References Cited

U.S. PATENT DOCUMENTS 5,878,661 A * 3/1999 Glovatsky et al. .......... 101/127

6,016,746 A * 1/2000 Lake et al. ................. 101/129
6,138,562 A * 10/2000 Hertz et al. ................ 101/129
6,505,553 B2 * 1/2003 Ishida et al. ............... 101/129

FOREIGN PATENT DOCUMENTS

| JP | 4-35090 | * | 2/1992 |
| JP | 5-131609 | * | 5/1993 |
| SU | 1666214 A1 | * | 7/1991 |

* cited by examiner

*Primary Examiner*—Leslie J. Evanisko
(74) *Attorney, Agent, or Firm*—Dellett & Walters

(57) ABSTRACT

A solder paste stenciling apparatus for minimizing residue of solder paste includes a stencil having multiple stencil openings defined therein, a supporting member retaining the stencil, and a vibrator for vibrating the stencil. In operation, a substrate is engaged to a bottom surface of the stencil, and solder paste is applied onto a top surface of the stencil so that the stencil openings are filled with the solder paste. The substrate is then slowly separated from the stencil while the vibrator vibrates the stencil to evacuate the solder paste out of the stencil openings and to further deposit on the substrate. Hence, the amount of residual solder paste adhered to inner surfaces defining the stencil openings is minimized.

8 Claims, 11 Drawing Sheets

US 6,675,704 B2

SOLDER PASTE STENCILING APPARATUS FOR MINIMIZING RESIDUE OF SOLDER PASTE

BACKGROUND OF THE INVENTION

1. Field of the Invention

The present invention relates to the field of solder paste stenciling, and more specifically to a solder paste stenciling apparatus for minimizing residue of solder paste.

2. Description of Related Art

Solder paste stenciling is a technique for depositing solder onto a substrate such as a printed circuit board. The purpose of doing so is when an electrical component is engaged onto the substrate, the deposited solder therebetween becomes a conductive substance that electrical connects the substrate and the electrical component together.

With reference to FIG. 9, a conventional solder paste stenciling apparatus mainly includes a stencil (70), a supporting member (72) for retaining the stencil (70) and a squeegee (73). In operation, a substrate (80) is engaged to a bottom surface of the stencil (70). Solder paste (74 shown in FIG. 10A) is applied onto a top surface of the stencil (70). The squeegee (73) is then used to level the solder paste (74) so that stencil openings (71) defined in the stencil (70) are filled with the solder paste (74) as shown in FIG. 10A. With reference to FIGS. 10B and 10C, the substrate (80) and the stencil (70) are slowly separated afterwards so that due to viscosity and gravity, most of the solder paste (74) is drawn out of the stencil openings (71) and deposited on the substrate (80). At the same time a portion of the solder paste (74) is adhered on an inner surface defining the stencil openings (71) and forms residue (75).

However, when the stencil openings (71) defined in the substrate (80) are configured to have a large aspect ratio (=depth/width), the amount of residue (75) will increase and consequently, the amount of solder paste (80) deposited will decrease. Therefore, two main problems arise from this phenomenon. Firstly, after stenciling several times, the stencil openings (71) may easily become blocked by the residue (75). Secondly, the insufficient amount of solder paste (74) deposited will effect the performance of the substrate (80) or more specifically, conductivity between the substrate (80) and an electrical component engaged thereon is impaired.

Therefore, contemporary solder paste stenciling focuses primarily on two solutions to overcome the mentioned problem. Firstly, the amount of residue (75) is reduced by slowing the separating process of the substrate (80) and the stencil (70) so that the viscosity and gravity are able to draw a lot of the solder paste (74) out of the stencil openings (71). Secondly, referring to FIG. 11, rollers (90) are used to clean the stencil openings (71), and as shown in FIG. 12, a cloth (91) and blowing means are used to urge the residue (75) out of the stencil openings (71). However, none of these methods provides a complete solution of the mentioned problem. The residue (75) still more or less adheres to the inner surface defining the stencil openings (71) after each stenciling operation.

Hence, the present invention intends to provide a solder paste stenciling apparatus for minimizing residue of solder paste.

SUMMARY OF THE INVENTION

The objective of the present invention is to provide a solder paste stenciling apparatus such that residual solder paste adhered in stencil openings of a stencil is minimized so that the number of times required to clean the stencil in order to prevent blocking of the stencil openings can be reduced if compared with a conventional stenciling apparatus of the like. Moreover, solder paste is uniformly and fully deposited on a substrate 80 that a high quality substrate can be produced.

Other objectives, advantages and novel features of the invention will become more apparent from the following detailed description when taken in conjunction with the accompanying drawings.

To achieve these objectives, a solder paste stenciling apparatus mainly includes a supporting member, a stencil retained on the supporting member and at least one vibrator for vibrating the stencil. The stencil has multiple stencil openings defined therein.

In operation, a substrate is engaged to a bottom surface of the stencil and solder paste is applied onto a top surface of the stencil. When the stencil and the substrate are slowly separated, the solder paste is deposited onto the substrate via the stencil openings while the at least one vibrator vibrates to minimize adhering of the solder paste in the stencil openings.

DETAILED DESCRIPTION OF THE PREFERRED EMBODIMENT

Figure 1:
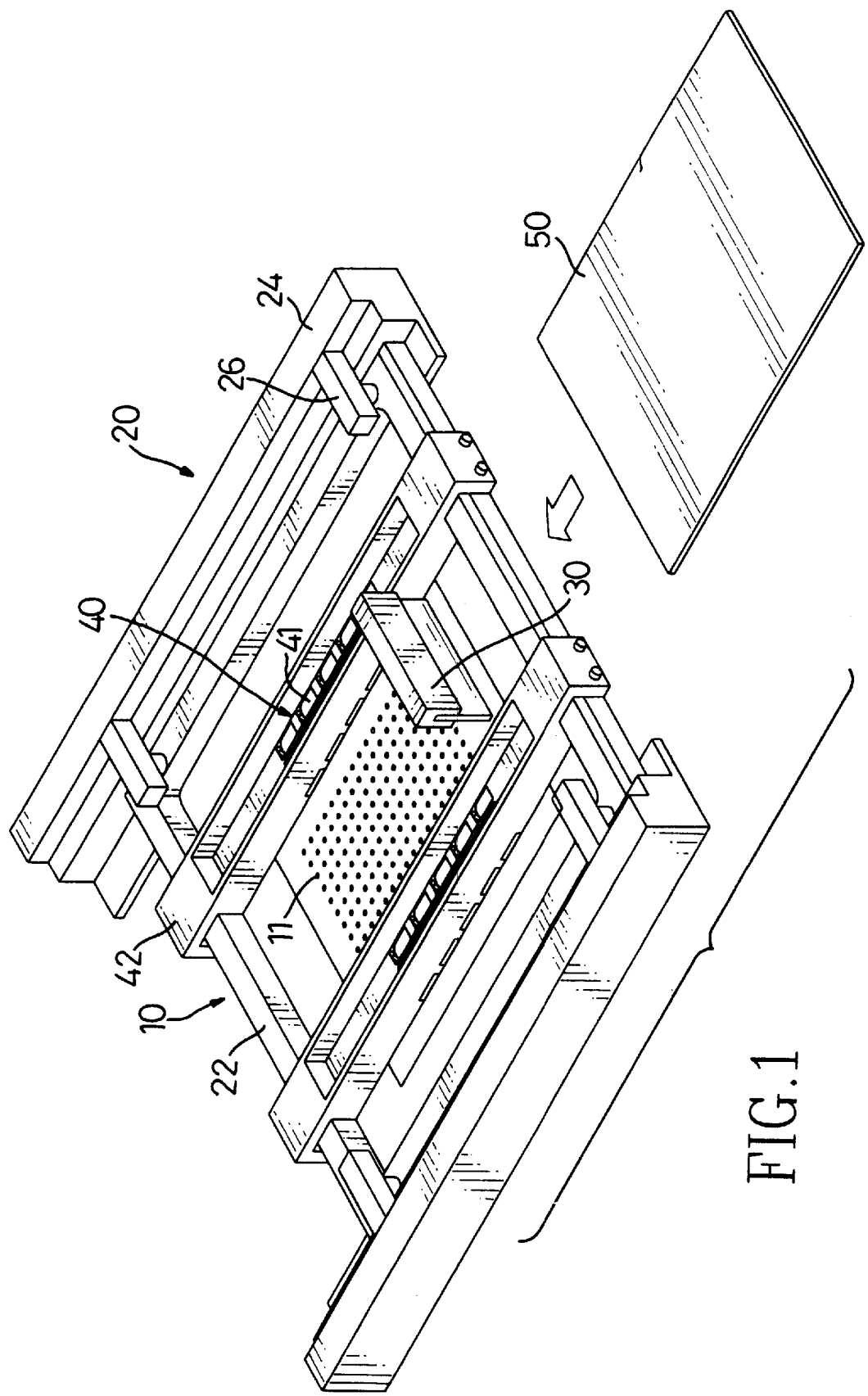
FIG. 1 is a perspective view of the first preferred embodiment of the present invention.

With reference to FIG. 1, a solder paste stenciling apparatus for minimizing residue of solder paste in accordance with the present invention mainly includes a stencil (10), a supporting member (20), a squeegee (30) and a vibrator (40).

Figures 2A, 2B, 2C:
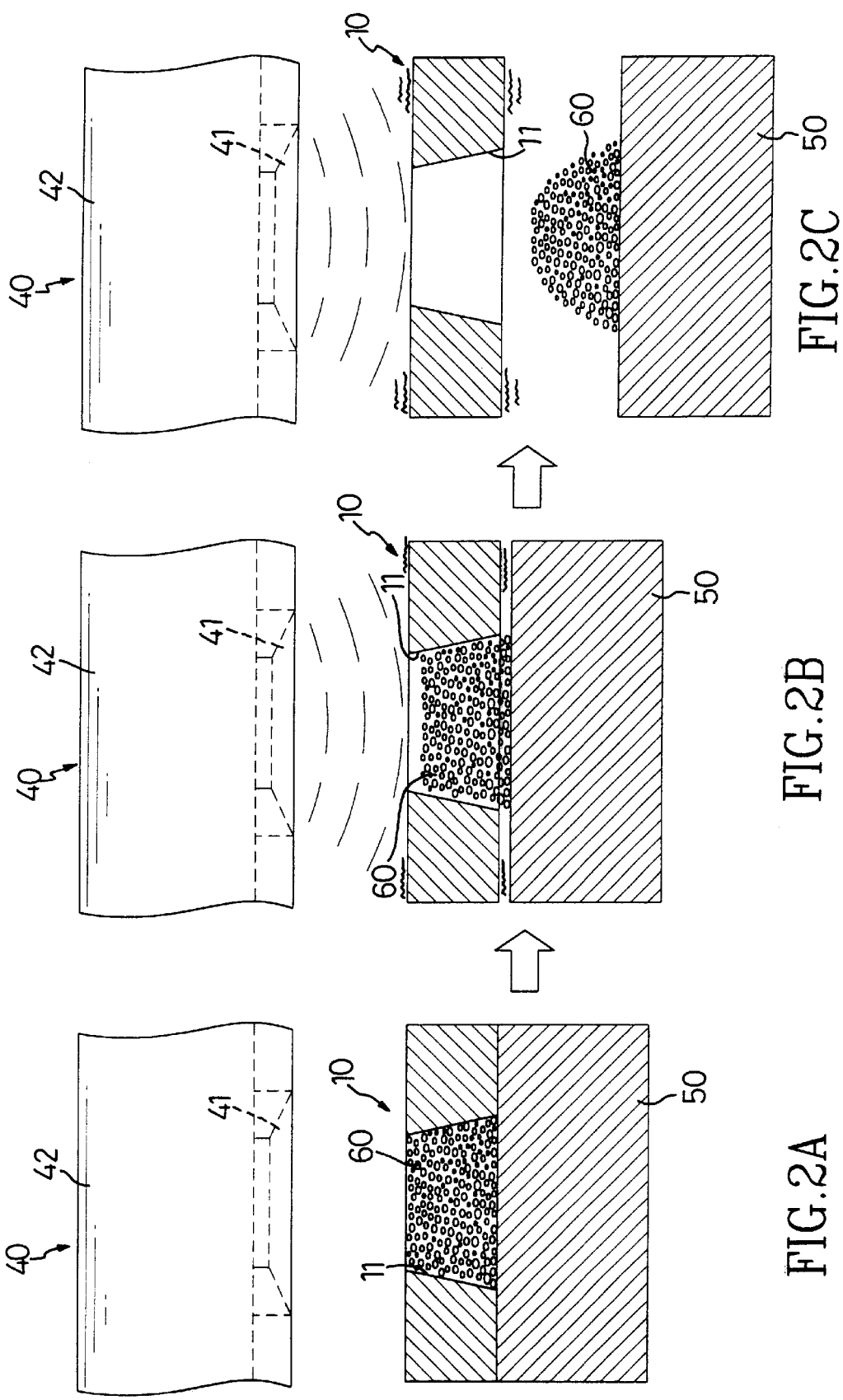
FIGS. 2A–2C is a series of schematic views showing the operation of the first embodiment.

The stencil (10) has multiple stencil openings (11) defined therein and distributed in a predetermined formation, wherein each one of the stencil openings (11) is tapered to have a large top opening and a small bottom opening as shown in FIG. 2A.

The supporting member (20) includes a frame (22) and two elongated bases (24). The stencil (10) is retained on the frame (22), and the frame (22) is further securely connected to the bases (24) by multiple connecting members (26).

The squeegee (30) is used to uniformly apply solder paste (60) onto the stencil {10 } so that the stencil openings (11) are filled with the solder paste (60) as shown in FIG. 2A.

The vibrator (40) is a device that is able to vibrate the stencil (10) horizontally, vertically or in an inclined manner with a preferred frequency that ranges between 2 Hz–20 Hz. Thereby, residual solder paste adhered on inner surfaces defining the stencil openings (11) can be evacuated. The vibrator (40) can be mounted either on the stencil (10), the supporting member (20) or the squeegee (30). In the first preferred embodiment shown in FIG. 1, the vibrator (40) includes two speakers (41) and two rods (42), wherein the rods (42) connect two opposite side edges of the frame (22) and the speakers (41) are respectively mounted in the rods (42).

Figure 12:
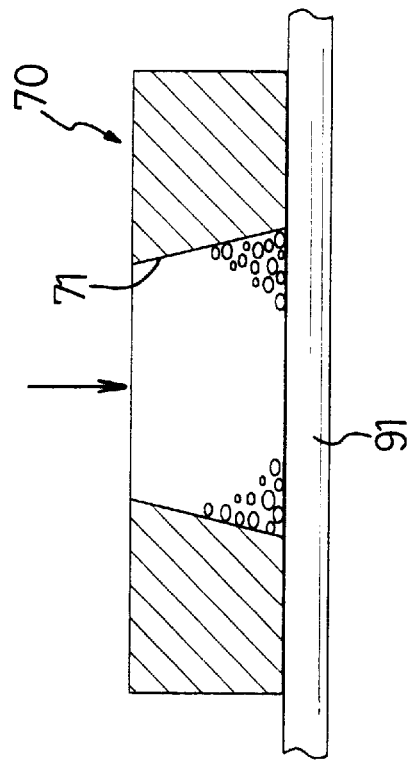
FIG. 12 is another schematic view showing the cleaning operation of the conventional solder paste stenciling apparatus using a cloth and a blowing means.
Figure 11:
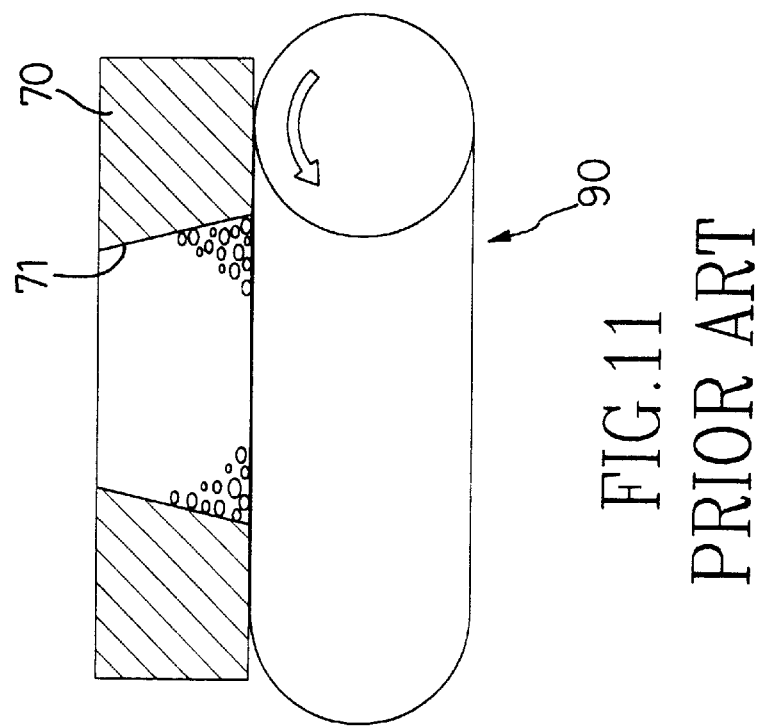
FIG. 11 is a schematic view showing the cleaning operation of the conventional solder paste stenciling apparatus using a roller.

With reference to FIGS. 2A–2C, in operation, the substrate {50} is engaged to a bottom surface of the stencil (10) such that locations on the stencil (10) to be later deposited with the solder paste (60) are aligned to the stencil openings (11). The solder paste (60) is then applied onto a top surface of the stencil (10) and the squeegee (30) is used to slide several times from forward to reverse over the top surface so that the stencil openings (11) are filled with the solder paste (60). Next, the substrate (50) is slowly separated from the stencil (10) so that the solder paste (60) is drawn out of the stencil openings (11) by gravity and viscosity to deposit on the substrate (50). During this depositing process, each speaker (41) generates sonic waves that vibrate the stencil (10) to help the solder paste (60) to completely evacuate from the stencil openings (11), or in other words, minimize the amount of residual solder paste that adheres to the inner surface defining the stencil openings (11). Therefore, the solder paste (60) is fully deposited on the substrate (50) so that the quality of the finished substrate is high. Moreover, due to that the amount of the residual solder paste is minimized, the cleaning procedures using a roller (90) and a cloth (91) as shown in FIGS. 11 and 12 are no longer required or at least the number of times required to clean the stencil (10) can be reduced if compared with a conventional solder paste stenciling apparatus.

Figure 3:
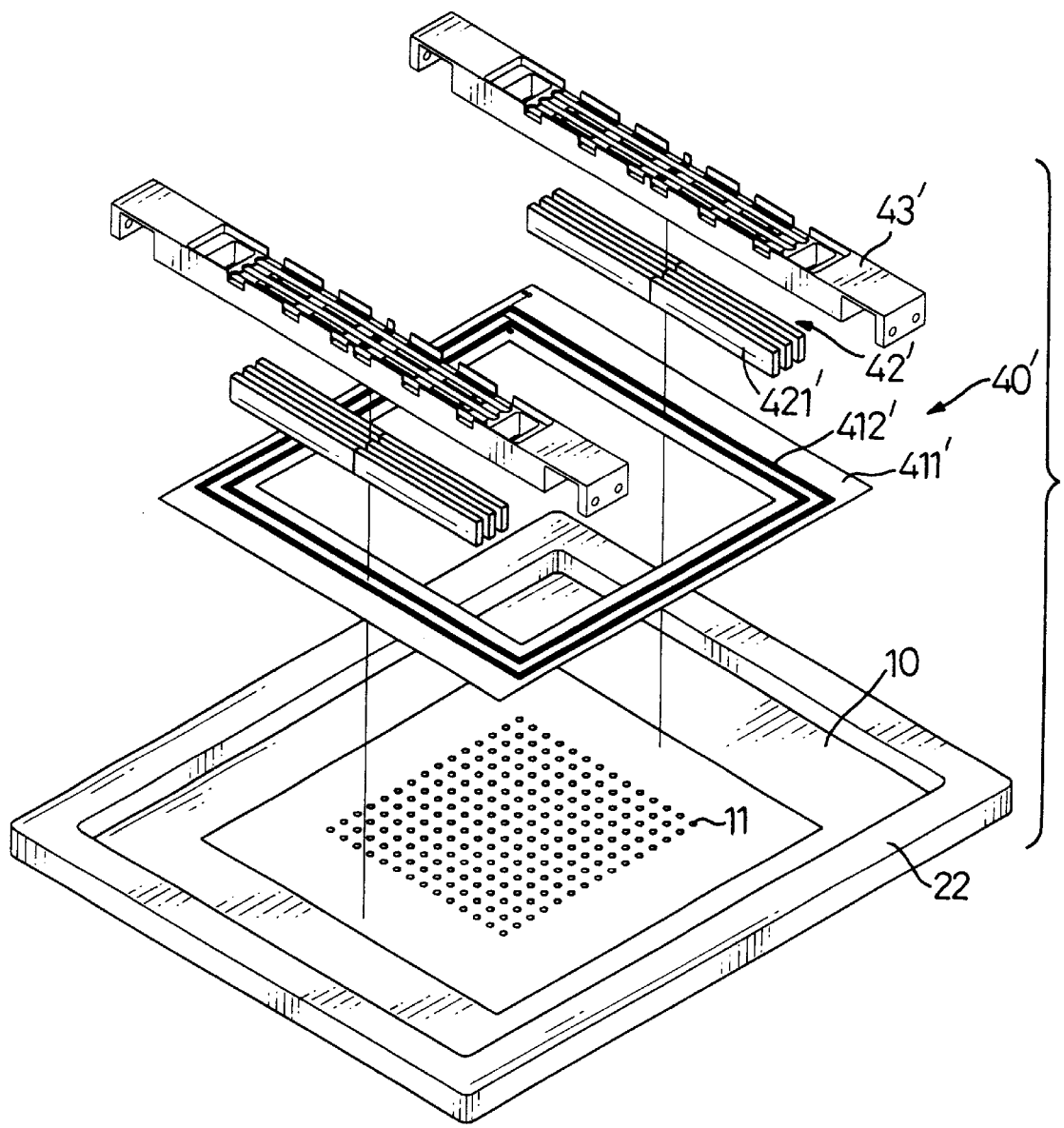
FIG. 3 is an exploded, perspective view of the second preferred embodiment of the present invention.
Figure 4:
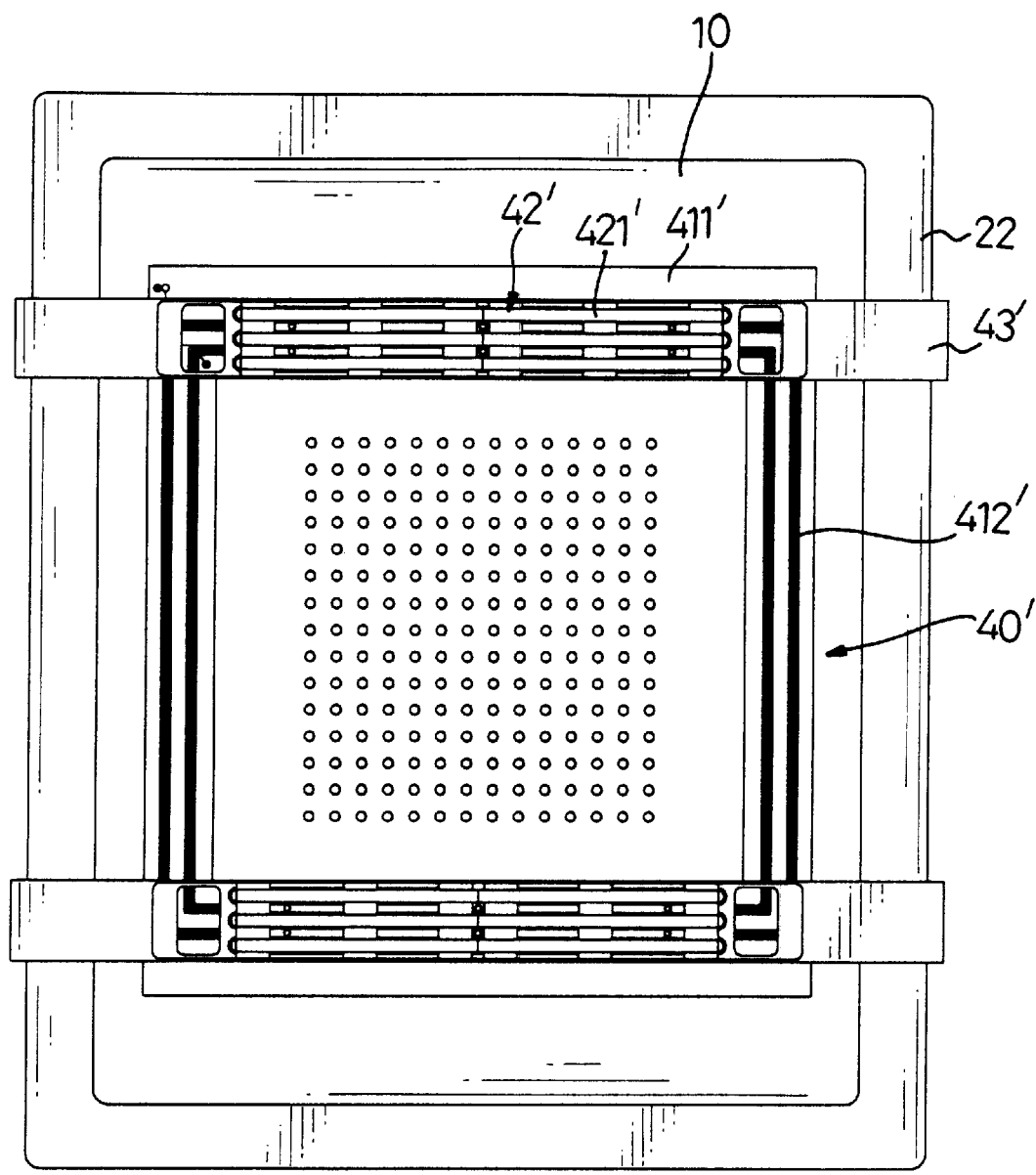
FIG. 4 is a plane view of the second preferred embodiment in assembly.
Figure 5:
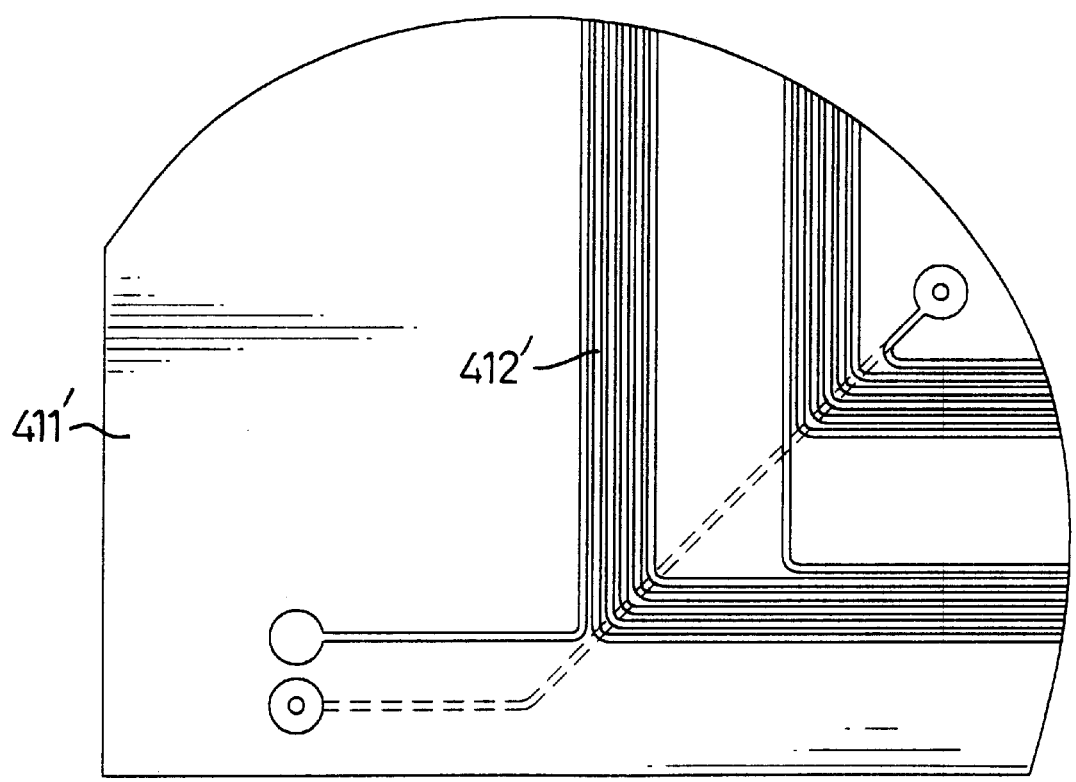
FIG. 5 is a partially enlarged, plane view showing coils of the second preferred embodiment.
Figure 6:
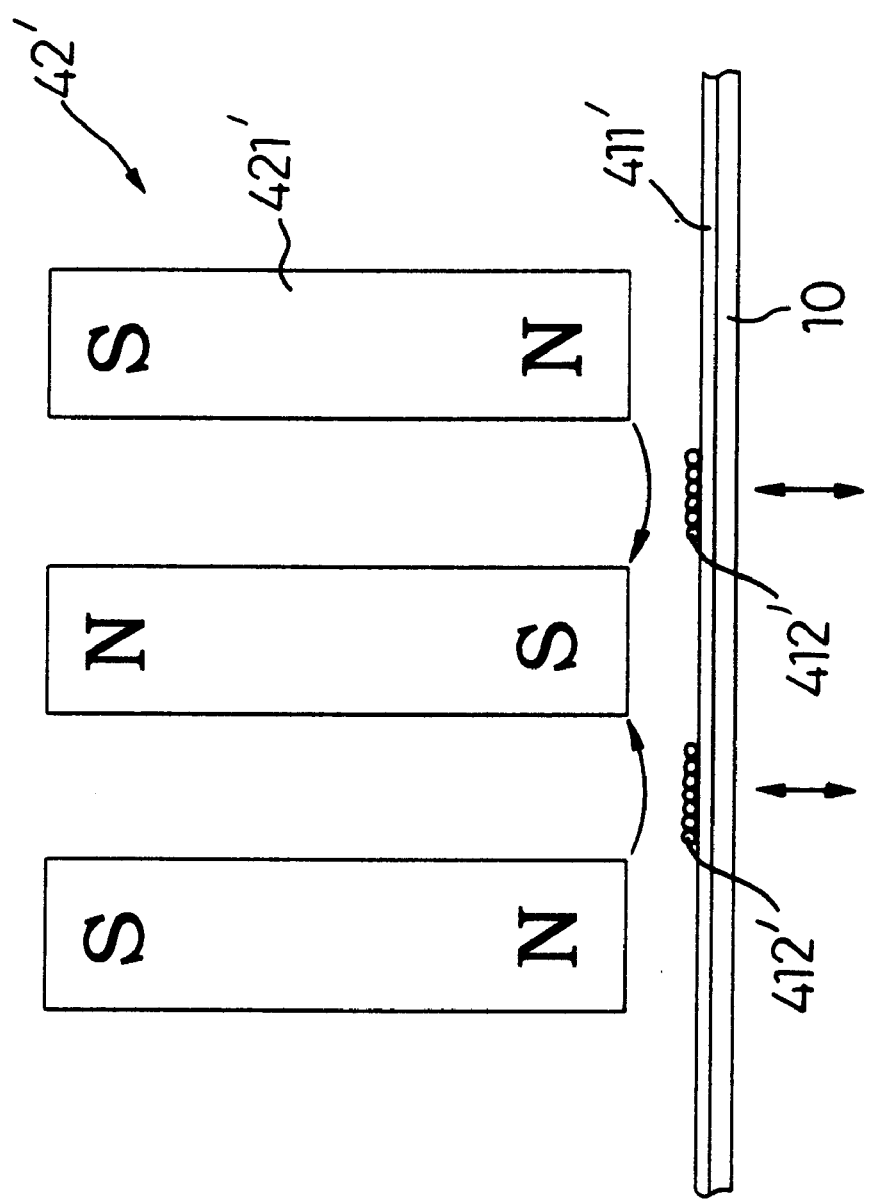
FIG. 6 is a plane view showing magnets and the coils of the second preferred embodiment.

With reference to FIGS. 3 and 4, the second preferred embodiment of the present invention is shown and has two vibrators (40') to replace said vibrators (40) while other components remain the same as the first preferred embodiment. Each vibrator (40') includes a substrate (411') mounted around the stencil (10) and two sets of coils (412') mounted on the substrate (411'), wherein each set of the coils (412') is connected with the other set and has an end respectively connected to a positive and a negative pole of a power source as shown in FIG. 5. Each vibrator (40') also includes two first rods (43') connecting the two side edges of the frame (22) and each first rod (43') has a first magnetic assembly (42') mounted therein. Three first magnets (421') are included in each first magnetic assembly (42') and the magnetic poles of the adjacent first magnets (421') are oppositely disposed as shown in FIG. 6. Furthermore, the first magnets (421') are at a position where each set of the coils (412') locates between and below the adjacent first magnets (421'). Therefore, in operation, the coils (412') are electrified so that according to the Fleming's Left-hand Rule, a temporary magnetic field is created and interacts with the magnets (421') to vibrate the stencil (10) vertically.

Figure 7:
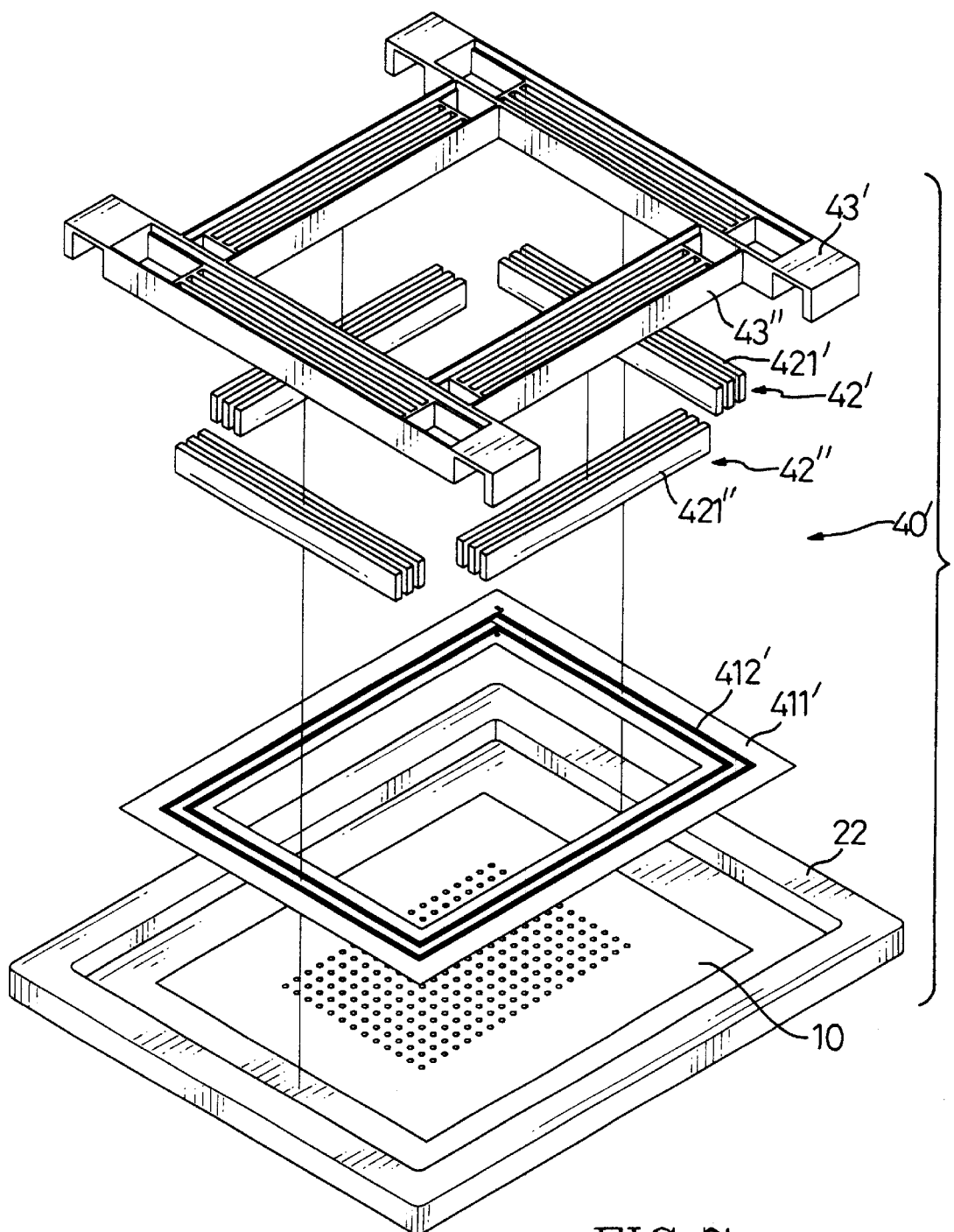
FIG. 7 is an exploded, perspective view of the third preferred embodiment of the present invention.
Figure 8:
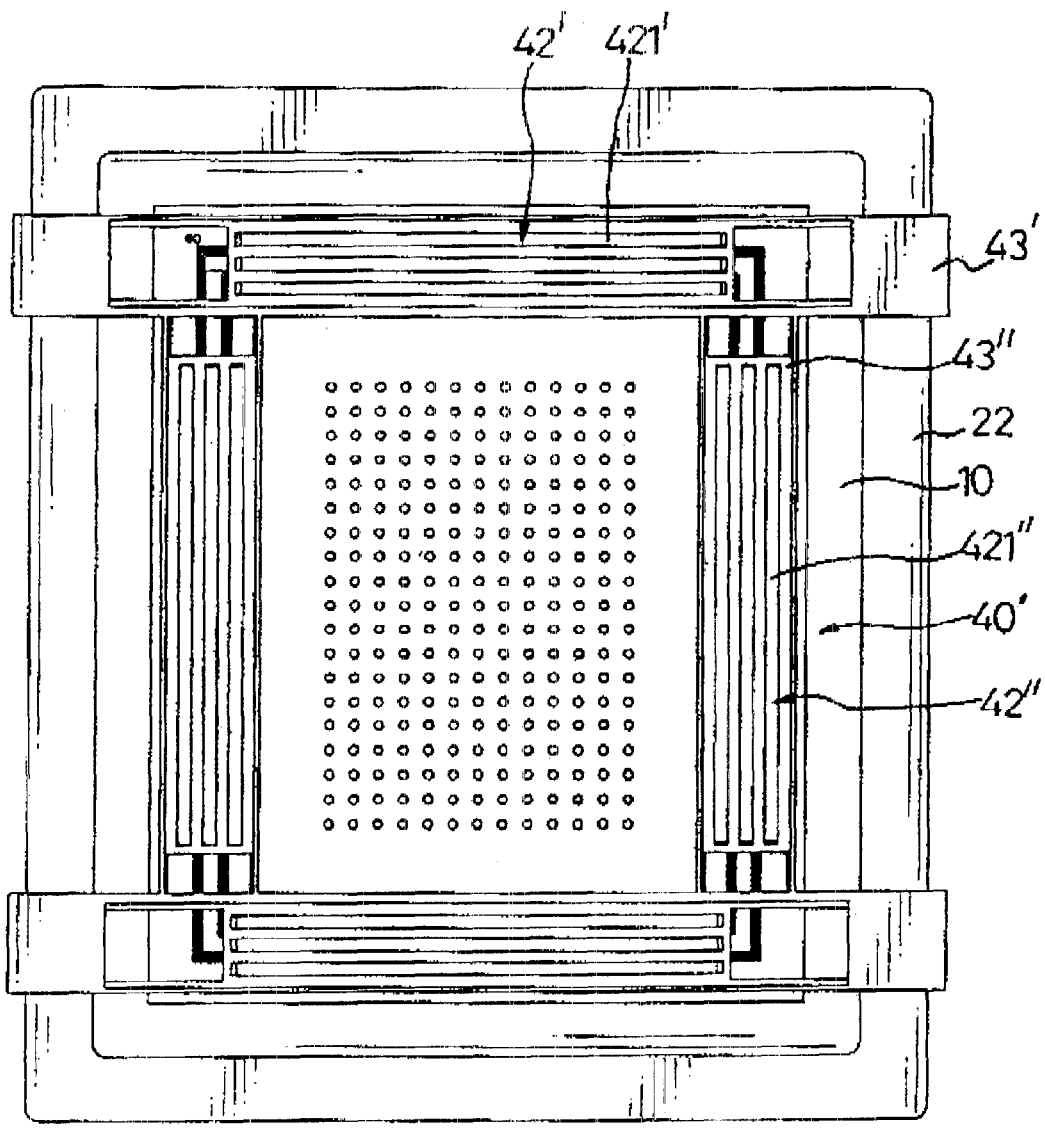
FIG. 8 is a plane view of the third preferred embodiment in assembly.
Figure 9:
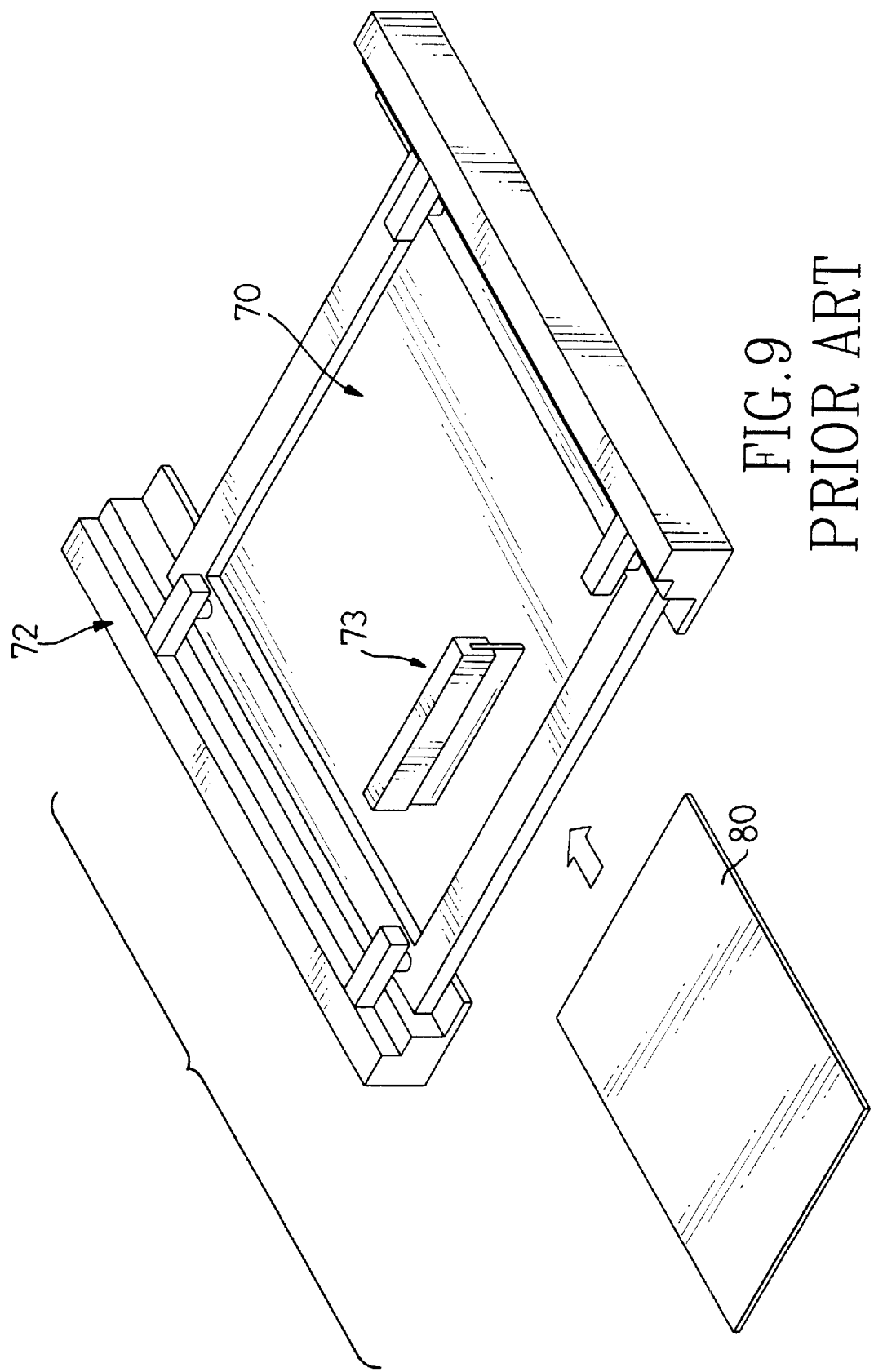
FIG. 9 is a perspective view of a conventional solder paste stenciling apparatus.
Figure 10C:
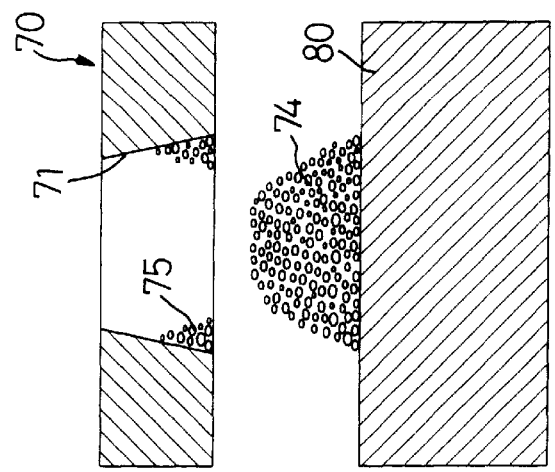
FIGS. 10A–10C is a series of schematic views showing the operation of the conventional solder paste stenciling apparatus.
Figure 10B:
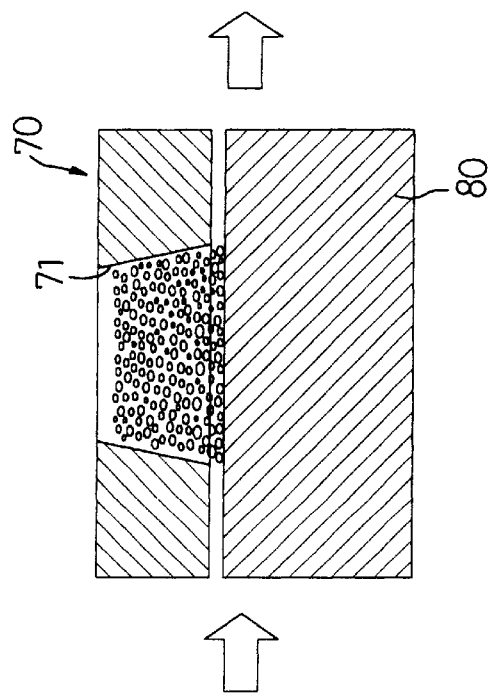
Figure 10A:
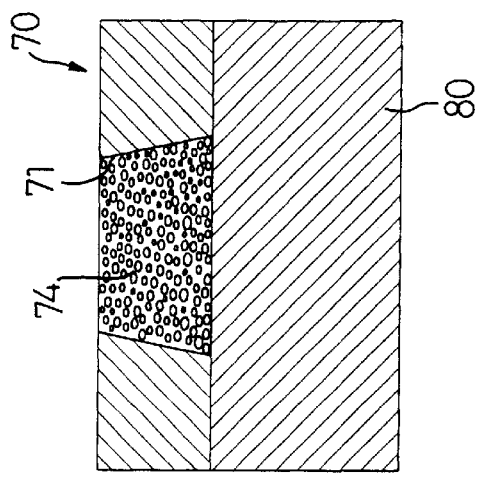

Further referring to FIGS. 7 and 8, the third preferred embodiment of the present invention is shown. In this preferred embodiment, two additional second rods (43") are provided and connect the first rods (43') previously mentioned. Each of the second rods (43") includes a second magnetic assembly (42") and each second magnetic assembly (42") further includes three second magnets (421"), wherein the second magnets (421") are disposed in the same manner as described for the first magnets (421'). Therefore, the third embodiment includes four second magnetic assemblies (42") instead of two so that the vibration of the stencil (10) is strengthened if compared with the second preferred embodiment.

It is noted from the above description, the solder paste stenciling apparatus for minimizing residue of solder paste in accordance with the present invention has the following advantages:

1. the amount of residual solder paste adhered on the inner surface defining the stencil openings (11) is minimized so that the number of times required to clean stencil (10) after operations can be reduced if compared with a conventional solder paste stenciling apparatus.
2. the solder paste (60) is fully and uniformly deposited on the substrate (50) so that the quality of the finish substrate is high.

While this invention has been particularly shown and described with references to the preferred embodiment thereof, it will be understood by those skilled in the art that various changes in form and details may be made therein without departing from the scope of the invention encompassed by the appended claims.

What is claimed is:

1. A solder paste stenciling apparatus comprising:
   a supporting member;
   a stencil retained on the supporting member and having multiple stencil openings defined therein;
   at least one vibrator for vibrating the stencil,
   whereby in operation, a substrate is engaged to a bottom surface of the stencil and solder paste is applied onto a top surface of the stencil so that when the stencil and the substrate are slowly separated, the solder paste is deposited onto the substrate via the stencil openings while the at least one vibrator vibrates to minimize adhering of the solder paste in the stencil openings and, wherein the at least one vibrator includes at least one magnetic assembly, a second substrate is mounted around the stencil and at least one set of coils is mounted on the second substrate so that when the coils are electrified, a temporary magnetic field is created and interacts with the magnetic assembly to vibrate the stencil.

2. The solder paste stenciling apparatus as claimed in claim 1 further comprising a squeegee to level the solder paste and to fill the stencil openings with the solder paste.

3. The solder paste stenciling apparatus as claimed in claim 1, wherein the supporting member includes a frame and multiple elongated bases, the stencil is retained on the frame and the frame is securely connected to the elongated bases by multiple connecting members.

4. The solder paste stenciling apparatus as claimed in claim 3, further comprising at least one rod connecting two side edges of the frame, wherein the at least one magnetic assembly is received in the at least one rod.

5. The solder paste stenciling apparatus as claimed in claim 1 wherein the vibrator vibrates the stencil horizontally.

6. The solder paste stenciling apparatus as claimed in claim 1, wherein the vibrator vibrates the stencil vertically.

7. The solder paste stenciling apparatus as claimed in claim 1, wherein the vibrator vibrates the stencil in an inclined manner.

8. The solder paste stenciling apparatus as claimed in claim 1, wherein the vibrator vibrates the stencil with a preferred frequency that ranges from 2 Hz to 20 kHz.

* * * * *